(12) United States Patent
Sugihara et al.

(10) Patent No.: US 9,502,613 B2
(45) Date of Patent: Nov. 22, 2016

(54) METHOD FOR MANUFACTURING LIQUID CRYSTAL DISPLAY DEVICE

(71) Applicant: Sharp Kabushiki Kaisha, Osaka (JP)

(72) Inventors: Yasuhiko Sugihara, Osaka (JP); Takeyuki Ashida, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 34 days.

(21) Appl. No.: 14/425,303

(22) PCT Filed: Aug. 28, 2013

(86) PCT No.: PCT/JP2013/072943
§ 371 (c)(1),
(2) Date: Mar. 2, 2015

(87) PCT Pub. No.: WO2014/038439
PCT Pub. Date: Mar. 13, 2014

(65) Prior Publication Data
US 2015/0270438 A1  Sep. 24, 2015

(30) Foreign Application Priority Data

Sep. 4, 2012  (JP) .................................. 2012-194508

(51) Int. Cl.
*H01L 21/00* (2006.01)
*H01L 33/12* (2010.01)
(Continued)

(52) U.S. Cl.
CPC ............. *H01L 33/12* (2013.01); *G02F 1/1303* (2013.01); *G02F 1/1333* (2013.01);
(Continued)

(58) Field of Classification Search
CPC .......... H01L 2224/73265; H01L 2224/32145; H01L 33/60; H01L 33/64; H01L 2224/81203; H01L 25/0655; H01L 2224/85203

USPC ............................................ 438/27, 118, 106
IPC ............................................ H01L 33/50,33/58
See application file for complete search history.

(56) References Cited

U.S. PATENT DOCUMENTS 6,562,659 B1    5/2003   Izumi et al.

FOREIGN PATENT DOCUMENTS

| JP | 2000-98413 A | 4/2000 |
| JP | 2001-201727 A | 7/2001 |

(Continued)

OTHER PUBLICATIONS

Machine Translation JP10-272356.*

*Primary Examiner* — Sonya D McCall Shepard
(74) *Attorney, Agent, or Firm* — Chen Yoshimura LLP

(57) ABSTRACT

The present invention provides a method for manufacturing a liquid crystal display device capable of reducing thermal damage to a polarizing plate during thermo-compression bonding, thereby sufficiently preventing the occurrence of defects due to the deformation of the polarizing plate. The method for manufacturing a liquid crystal display device according to the present invention is for thermo-compression bonding a terminal portion of a liquid crystal panel and an external circuit using a pressure bonding device configured of a stage, a heat source, and a buffer member. The manufacturing method includes placing the liquid crystal panel on the stage, and thermo-compression bonding the terminal portion of the liquid crystal panel and the external circuit by heat from the heat source via the buffer member interposed between the heat source and the external circuit. The pressure bonding device has a heat shield member that shields heat from the heat source to the polarizing plate, and/or a heat dissipation portion that dissipates heat from the heat source. In the thermo-compression bonding, the heat shield member and/or the heat dissipation portion overlap with at least a part of the polarizing plate bonded to the liquid crystal panel when planarly viewing the principal surface of the panel.

11 Claims, 6 Drawing Sheets

(51) Int. Cl.
  G02F 1/1345    (2006.01)
  H01L 23/00     (2006.01)
  G02F 1/1333    (2006.01)
  H01L 33/00     (2010.01)
  H01L 33/16     (2010.01)
  H01L 33/58     (2010.01)
  H01L 33/64     (2010.01)
  G02F 1/13      (2006.01)
  G02F 1/1335    (2006.01)

(52) U.S. Cl.
  CPC ........ *G02F 1/1345* (2013.01); *G02F 1/13452* (2013.01); *G02F 1/133382* (2013.01); *H01L 24/74* (2013.01); *H01L 24/80* (2013.01); *H01L 33/0095* (2013.01); *H01L 33/16* (2013.01); *H01L 33/58* (2013.01); *H01L 33/642* (2013.01); *H01L 33/644* (2013.01); *G02F 1/133528* (2013.01); *H01L 24/08* (2013.01); *H01L 2224/08225* (2013.01); *H01L 2224/74* (2013.01); *H01L 2224/75252* (2013.01); *H01L 2224/75253* (2013.01); *H01L 2224/75315* (2013.01); *H01L 2224/80203* (2013.01); *H01L 2924/15788* (2013.01); *H01L 2933/0033* (2013.01); *H01L 2933/0058* (2013.01); *H01L 2933/0075* (2013.01)

(56) References Cited

FOREIGN PATENT DOCUMENTS

JP    2001-230577 A    8/2001
JP    2005-197729 A    7/2005

\* cited by examiner

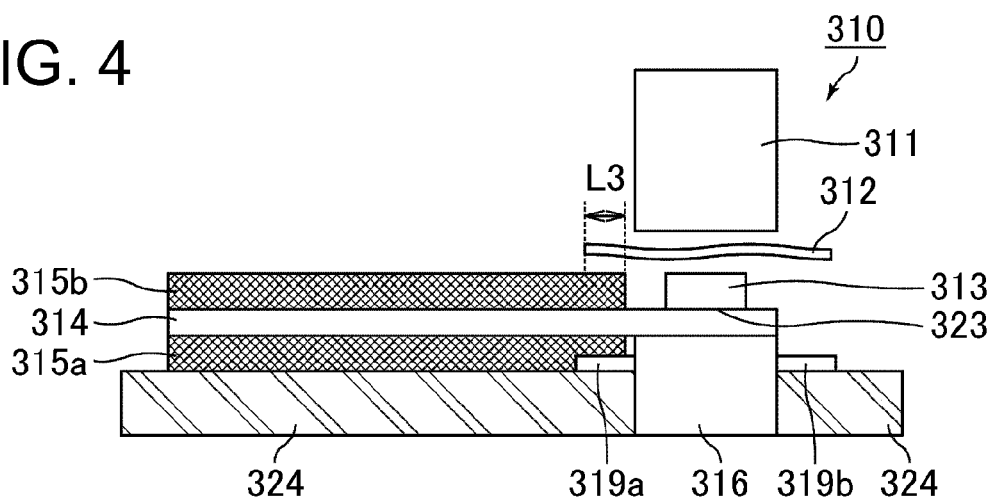
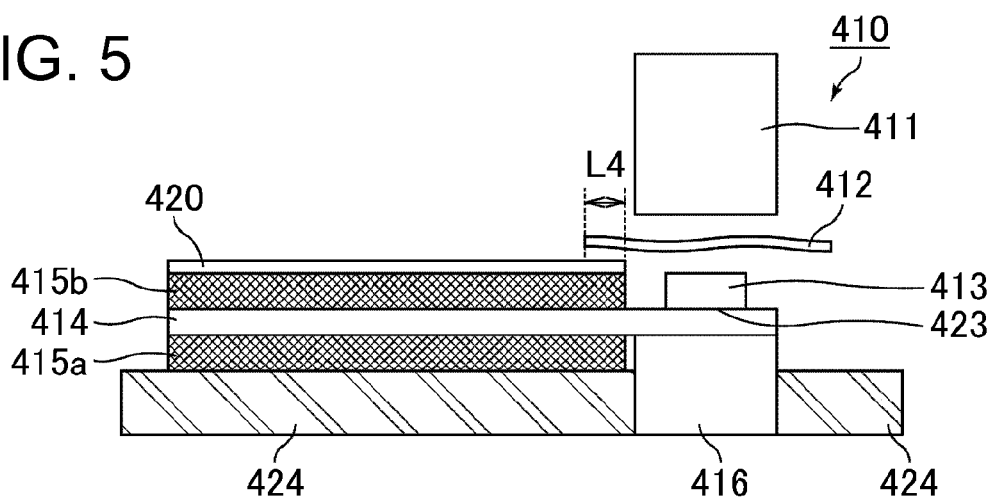
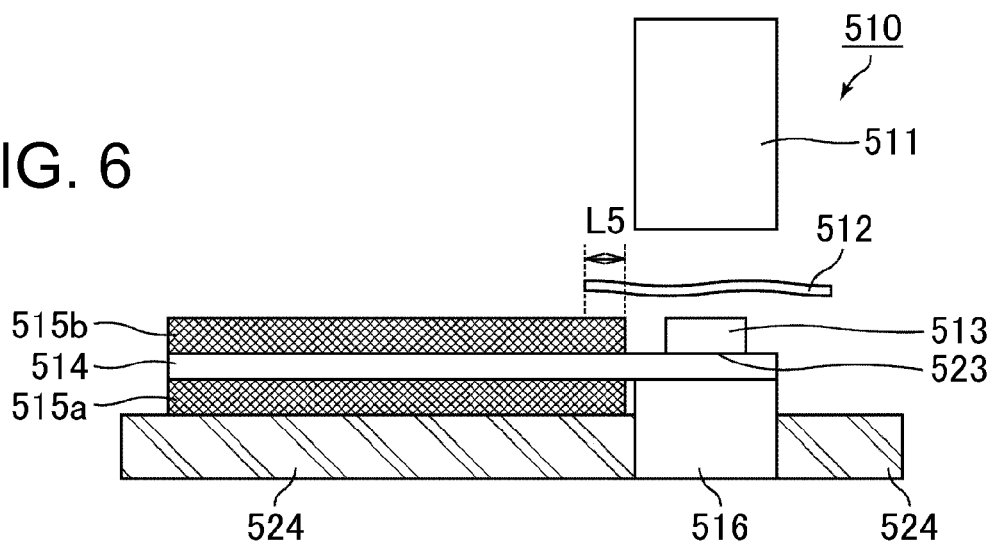

FIG. 7
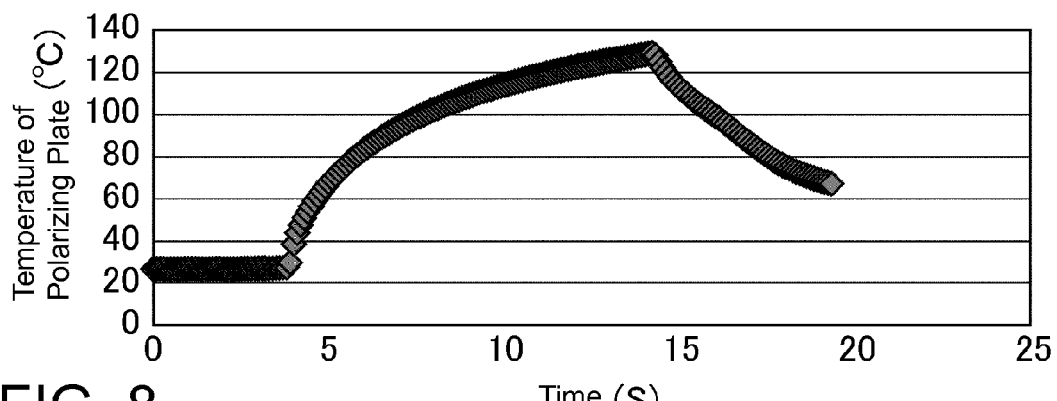
FIG. 8
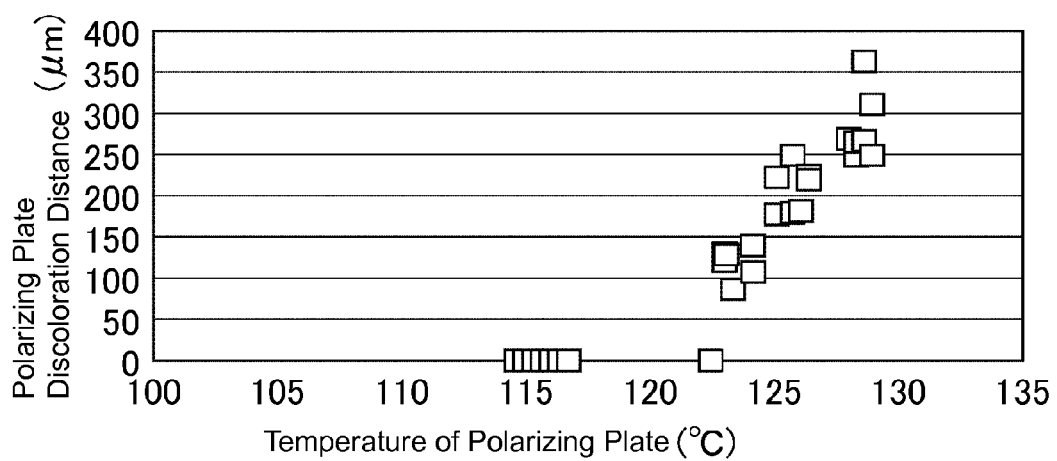
FIG. 9
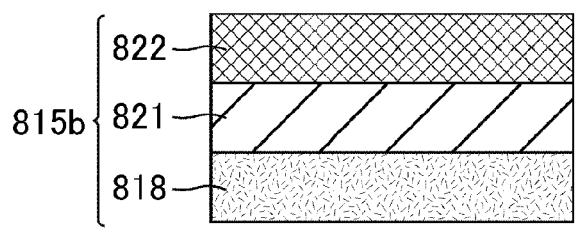
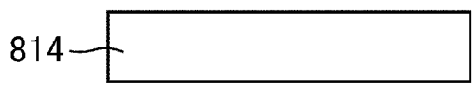

METHOD FOR MANUFACTURING LIQUID CRYSTAL DISPLAY DEVICE

TECHNICAL FIELD

The present invention relates to a method for manufacturing a liquid crystal display device. In particular, the present invention relates to a method for manufacturing a liquid crystal display device suitable for obtaining a liquid crystal display device having a narrow frame.

BACKGROUND ART

Liquid crystal display devices are configured by interposing a liquid crystal display element between a pair of glass substrates or the like, and the thin, lightweight, and power-efficient characteristics of these devices have made them indispensable in daily life and business, for mobile uses, in various types of monitors and televisions, and so on. In recent years, liquid crystal display devices are being employed in a broad range of applications, such as electronic books, photo frames, IAs (Industrial Appliances), PCs (Personal Computers), tablet PCs, smartphones, and the like.

As the miniaturization of liquid crystal panels in liquid crystal display devices progresses, it is desirable to use as much of the display area of the liquid crystal panel as possible and to reduce the size of a terminal portion aside from the display area of the liquid crystal panel, exterior portions that cover the liquid crystal panel, and so on (also called narrowing the frame of a liquid crystal display device hereinafter).

A liquid crystal display device generally has multiple terminal portions, and it is necessary to lead the terminal portions to an external circuit. The COG (Chip on Glass) method, the TCP (Tape Carrier Package) method, and so on are used as general methods thereof.

The stated COG method is a method for mounting (pressure-bonding) an IC (Integrated Circuit) directly to a terminal portion (gate electrode and source electrode) of a thin-film transistor (TFT) substrate as the external circuit (also called a COG driver hereinafter). An FPC (Flexible Printed Circuit) is used for inputting and outputting signals to and from the IC and so on.

The stated TCP method is a method of mounting (pressure-bonding) a package, on which an IC is mounted by forming a wiring pattern of copper foil or the like on a TCP substrate having a base film of polyimide or the like, as an external circuit on a terminal portion (gate electrode and source electrode) of a TFT substrate.

The following can be given as examples of a pressure bonding device and a pressure bonding method (mounting method) that use the stated COG method and the stated TCP method.

Patent Document 1, for example, discloses a method for mounting an external circuit by mounting the external circuit on an input/output terminal of a substrate including an amorphous semiconductor layer by thermo-compression bonding, including holding a temperature of the amorphous semiconductor layer under the crystallizing temperature thereof while the thermo-compression bonding is being carried out by supplying a cooling medium at an angle from the input/output terminal side to at least one of a surface of the substrate on which the amorphous semiconductor layer is formed and a rear surface side thereof and cooling at least an area between a portion of the substrate where the input/output terminal and the external circuit are thermo-compression bonded and the amorphous semiconductor layer or at least an area of the amorphous semiconductor layer near the input/output terminal.

Patent Document 2, for examples, discloses a thermo-compression bonding device having a support platform and a thermo-compression bonding head that compresses a terminal portion of a liquid crystal display panel placed on the support platform with a connection portion of a flexible printed substrate stacked upon the terminal portion, the thermo-compression bonding device including a cooling member, and the cooling member being configured of a heat conductor and dissipating heat from a polarizing plate laminated to a surface of the liquid crystal display panel by making contact with the polarizing plate.

RELATED ART DOCUMENTS

Patent Documents

Patent Document 1: Japanese Patent Application Laid-Open Publication No. 2005-197729

Patent Document 2: Japanese Patent Application Laid-Open Publication No. 2001-201727

SUMMARY OF THE INVENTION

Problems to be Solved by the Invention

Although it is desirable to narrow the frames of liquid crystal display devices (to narrow the frames of liquid crystal display device in mobile devices, for example) as described above, narrowing the frame of a liquid crystal display device reduces flexibility in the mounting design when pressure-bonding a COG driver, for example; as a result, there have been cases where a pressure-bonding area for pressure-bonding the COG driver has been reduced in size (for example, there has been a case, in a pressure bonding device 510 for a conventional method for manufacturing a liquid crystal display device illustrated in FIG. 6, where a distance between a COG driver 513 and a polarizing plate 515*b* is less than or equal to 1.0 mm). As such, when pressure-bonding the COG driver, a heat source provided in the pressure bonding device descends adjacent to the vicinity of an end surface of the polarizing plate laminated to the liquid crystal panel; this has resulted in defects such as the end surface of the polarizing plate being burned, deformed, or the like, which has posed a problem. Here, for example, when pressure-bonding the COG driver 513 to a terminal portion 523 of the liquid crystal panel using a heat source 511 in the pressure bonding device 510 used in the conventional method for manufacturing a liquid crystal display device illustrated in FIG. 6, a distance between the COG driver 513 and the polarizing plate 515*b* is narrow at greater than or equal to 0.3 mm and less than or equal to 1.0 mm, for example. The thermo-compression bonding operation is thus carried out in a state where the end faces of the heat source 511 and the polarizing plate 515*b* are close to each other. Accordingly, there has been a problem that the effects of heat from the heat source 511 have caused defects such as the end face of the polarizing plate 515*b* being burned, deforming, or the like.

Discoloration of a polarizer provided with the polarizing plate (also called polarizing plate discoloration hereinafter), cracking in a retardation plate provided in the polarizing plate (also called polarizing plate cracking hereinafter), peeling of an adhesive on the polarizing, and so on can be given as examples of such defects in a polarizing plate. FIG.

9 is a cross-sectional schematic diagram illustrating the configuration of a liquid crystal panel provided in a liquid crystal display device and a polarizing plate on the liquid crystal panel. FIG. 10 is a cross-sectional schematic diagram illustrating the configuration of a liquid crystal panel provided in a liquid crystal display device and a polarizing plate, which is different from the polarizing plate in FIG. 9, on the liquid crystal panel. The defects affecting the polarizing plate due to heat from the stated heat source during thermo-compression bonding are, in a configuration in which a polarizing plate 815b is laminated onto a liquid crystal panel 814 as illustrated in FIG. 9, discoloration of a polarizer 822, cracking in a retardation plate 821, and peeling of an adhesive 818, and are, in a configuration in which a polarizing plate 915b is laminated onto a liquid crystal panel 914 as illustrated in FIG. 10, discoloration of a polarizer 922, cracking in a retardation plate 921a and a retardation plate 921b, and peeling of an adhesive 918a. The polarizing plate discoloration, polarizing plate cracking, and adhesive peeling in the polarizing plate will be described in detail hereinafter.

<Polarizing Plate Discoloration>

FIG. 11 shows photographs illustrating discoloration levels in a polarizing plate provided in a liquid crystal display device. Table 1 below indicates results of evaluating the discoloration levels in the polarizing plate provided in the liquid crystal display device. Note that a polarizing plate A and a polarizing plate B are commercial products. With respect to the polarizing plate discoloration, it can be seen from Table 1 that the polarizer (polarizing plate) is discolored as the temperature applied to the end face of the polarizing plate during thermo-compression bonding rises (the polarizing plate is discolored as illustrated in FIG. 11, for example). This may lead to a risk of light leakage in the liquid crystal display device, and there is a risk of light leakage in cases aside from level C and level D illustrated in FIG. 11, for example. Meanwhile, depending on the material (solvent or the like) used when laminating a touch panel, there are cases where a monomer ingresses from damaged areas of the polarizing plate, which results in polarizing plate cracking (chemical stress cracking in a retardation plate included in the polarizing plate). Note that in the present specification, the temperature applied to the end portion of the polarizing plate refers to the temperature of the polarizing plate (a maximum temperature attained by the polarizing plate).

FIG. 8 is a graph illustrating a relationship between a polarizing plate discoloration distance and the temperature of the polarizing plate. From FIG. 8, it can be seen that discoloration occurs in the polarizing plate when the temperature of the polarizing plate exceeds 120° C., for example. Accordingly, keeping the temperature of the polarizing plate at 120° C. or less is preferable, as a benchmark for successfully preventing discoloration in the polarizing plate.

(Method for Evaluation of Discoloration Level in Polarizing Plate)

The level of discoloration in the polarizing plate was evaluated, with four levels being evaluated as guidelines for the polarizing plate discoloration distance, namely A: approximately 800 µm, B: approximately 400 µm, C: approximately 200 µm, and D: X=approximately 0 µm.

TABLE 1

| Maximum Temperature Attained by Polarizing Plate (° C.) | Time (s) | Polarizing Plate A | Polarizing Plate B |
| --- | --- | --- | --- |
| 100 | 10 | D | D |
|  | 25 | D | D |
|  | 40 | D | D |
| 110 | 10 | D | D |
|  | 25 | D | D |
|  | 40 | D | C |
| 120 | 10 | D | D |
|  | 25 | D | C |
|  | 40 | B | B |
| 130 | 10 | D | C |
|  | 25 | D | C |
|  | 40 | B | A |
| 140 | 10 | C | B |
|  | 25 | B | A |
|  | 40 | A | A |

Polarizing Plate Cracking

FIG. 12 is a photograph showing a crack in a polarizing plate provided in a liquid crystal display device. FIG. 13 is a graph illustrating a relationship between the rate at which cracking occurs in a polarizing plate provided in a liquid crystal display device and the temperature of the polarizing plate. With respect to the polarizing plate cracking, it can be seen from FIG. 13 that the rate at which polarizing plate cracking occurs increases as the temperature of the polarizing plate rises during thermo-compression bonding in the case where a material that induces chemical stress cracking makes contact therewith (for example, chemical stress cracks such as that seen in FIG. 12 are produced).

In addition, from FIG. 13, it can be seen that polarizing plate cracking occurs when the temperature of the polarizing plate exceeds 100° C. Accordingly, keeping the temperature of the polarizing plate at 100° C. or less is preferable, as a benchmark for successfully preventing polarizing plate cracking.

<Peeling of Adhesive in Polarizing Plate>

FIG. 14 is a graph illustrating a relationship between the extent to which an adhesive peels away in a polarizing plate provided in a liquid crystal display device and the temperature of the polarizing plate. With respect to the adhesive peeling in the polarizing plate, it can be seen from FIG. 14 that the adhesive in the polarizing plate peels away to a greater extent as the temperature of the polarizing plate rises during thermo-compression bonding.

In addition, from FIG. 14, it can be seen that the adhesive in the polarizing plate peels away when the temperature of the polarizing plate exceeds 110° C. Accordingly, keeping the temperature of the polarizing plate at 110° C. or less is preferable, as a benchmark for successfully preventing the adhesive in the polarizing plate from peeling away.

Thus, as described above, the defects caused by the polarizing plate deforming during thermo-compression bonding are more likely to occur the higher the temperature of the polarizing plate is during the thermo-compression bonding, and it has therefore been necessary to sufficiently reduce thermal damage to the polarizing plate during thermo-compression bonding. As a benchmark for solving these issues, it is preferable that the temperature of the polarizing plate be kept to 120° C. or less, further preferable that the temperature of the polarizing plate be kept to 110° C. or less, and particularly preferable that the temperature of the polarizing plate be kept to 100° C. or less.

The stated Patent Document 1 discloses a method for mounting an external circuit that, when mounting the external circuit on an input/output terminal of a substrate including an amorphous semiconductor layer by thermo-compression bonding, does not cause the amorphous semiconductor layer film to peel away, properties of the amorphous semiconductor layer to degrade, and so on. However, while the invention according to the stated Patent Document 1 is a method that cools by supplying a cooling medium, there is unevenness in the temperatures that individual members are subjected to, and thus a temperature-reduction effect is not achieved for all of the members; there has thus been room for improvement in measures for solving the aforementioned problems.

Meanwhile, the invention according to the stated Patent Document 2 does not disclose a specific indicator regarding thermal degradation in the polarizing plate (a target temperature for the polarizing plate, for example), and there has thus been room for improvement in measures for solving the aforementioned problems.

Having been achieved in light of the aforementioned circumstances, it is an object of the present invention to provide a method for manufacturing a liquid crystal display device capable of reducing thermal damage to a polarizing plate during thermo-compression bonding, thereby sufficiently preventing the occurrence of defects due to the deformation of the polarizing plate.

Means for Solving the Problems

In making various inquiries into methods for manufacturing a liquid crystal display device that reduce thermal damage inflicted on a polarizing plate during thermo-compression bonding and sufficiently prevent the occurrence of defects caused by the polarizing plate deforming, the inventors of the present invention focused on members that can suitably shield or diffuse heat from the heat source. The inventors arrived at a method for manufacturing a liquid crystal display device that thermo-compression-bonds a terminal portion of a liquid crystal panel and an external circuit using a pressure bonding device configured of a stage, a heat source, and a buffer member, where the pressure bonding device has a heat shield member that shields heat from the heat source to the polarizing plate, and/or a heat dissipation portion that dissipates heat from the heat source, and the heat shield member and/or the heat dissipation portion is caused to overlap with at least a part of the polarizing plate bonded to the liquid crystal panel during the thermo-compression bonding when planarly viewing a principal surface of the panel. The inventors discovered that this solves the aforementioned problem superbly, and arrived at the present invention as a result.

That is, according to an aspect of the present invention, a method of manufacturing a liquid crystal display device may be a method of manufacturing a liquid crystal display device in which a terminal portion of a liquid crystal panel and an external circuit are bonded together by thermo-compression using a pressure bonding device including a stage and a heat source, the method including: placing the liquid crystal panel on the stage; and thermo-compression bonding the terminal portion of the liquid crystal panel to the external circuit with heat from the heat source using a buffer member, at least a portion of the buffer member being interposed between the heat source and the external circuit during the thermo-compressing bonding, wherein, in the step of thermo-compression bonding, at least one of a heat shield member and a heat dissipation member is used, the heat shield member shielding a polarizing plate on the liquid crystal panel from heat from the heat source, the heat dissipation member dissipating heat from the heat source, and wherein, in the step of thermo-compression bonding, the at least one of the heat shield member and the heat dissipation member overlaps with at least a part of the polarizing plate bonded to the liquid crystal panel in a plan view of a principal surface of the liquid crystal panel.

As long as such processes are included as necessary items, other processes place no special limitation on the method for manufacturing a liquid crystal display device according to the present invention.

Effects of the Invention

According to an aspect of the present invention, a liquid crystal display device capable of reducing thermal damage to a polarizing plate during thermo-compression bonding, thereby sufficiently preventing the occurrence of defects due to the deformation of the polarizing plate, can be provided.

BRIEF DESCRIPTION OF THE DRAWINGS

FIG. 4 is a cross-sectional schematic diagram illustrating members included in a pressure bonding device, a liquid crystal panel, and so on during thermo-compression bonding in a method for manufacturing a liquid crystal display device according to Embodiment 3.

FIG. 5 is a cross-sectional schematic diagram illustrating members included in a pressure bonding device, a liquid crystal panel, and so on during thermo-compression bonding in a method for manufacturing a liquid crystal display device according to Embodiment 4.

FIG. 6 is a cross-sectional schematic diagram illustrating members included in a pressure bonding device, a liquid crystal panel, and so on during thermo-compression bonding in a conventional method for manufacturing a liquid crystal display device according to Comparison Example 1.

FIG. 7 is a graph illustrating a relationship between a temperature of a polarizing plate and time during thermo-compression bonding in the conventional method for manufacturing a liquid crystal display device according to Comparison Example 1.

FIG. 8 is a graph illustrating a relationship between a polarizing plate discoloration distance and a temperature of the polarizing plate.

FIG. 9 is a cross-sectional schematic diagram illustrating the configuration of a liquid crystal panel provided in a liquid crystal display device and a polarizing plate on the liquid crystal panel.

DETAILED DESCRIPTION OF EMBODIMENTS

Figure 1:
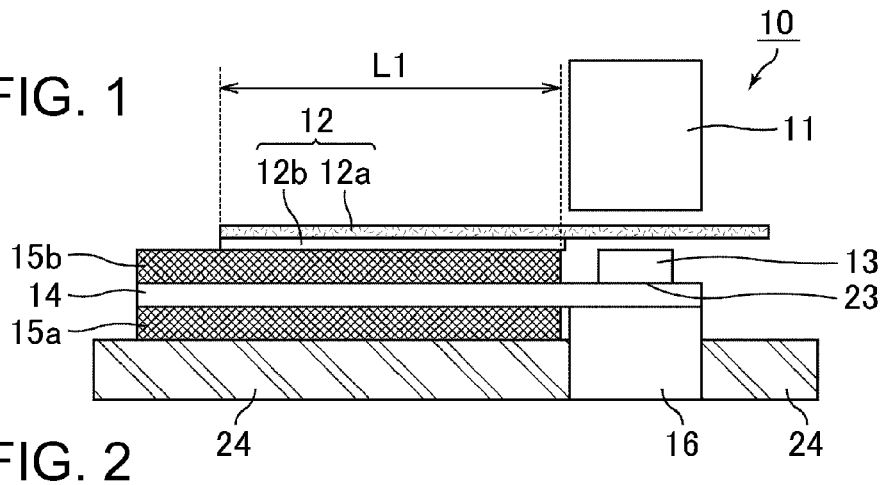
FIG. 1 is a cross-sectional schematic diagram illustrating members included in a pressure bonding device, a liquid crystal panel, and so on during thermo-compression bonding in a method for manufacturing a liquid crystal display device according to Embodiment 1.

Other preferred embodiments of the method for manufacturing a liquid crystal display device according to the present invention will be described hereinafter. Note that the various embodiments of the method for manufacturing a liquid crystal display device according to the present invention can be combined as appropriate.

Meanwhile, although the following describes a COG driver as the external circuit, another external circuit may be used; a heat source normally used in the technical field of the present invention may be used as the stated heat source.

According to an aspect of the present invention, it is preferable that the thickness of the buffer member vary by location.

The heat shield member that overlaps with the polarizing plate and/or the heat dissipation portion may constitute part of the buffer member. For example, according to an aspect of the present invention, it is preferable that the buffer member include the heat shield member and/or the heat dissipation portion; and that in the thermo-compression bonding, the part of the buffer member that overlaps with the polarizing plate be configured from the heat shield member and/or the heat dissipation portion, and the thickness of that part be greater than the thickness of a part that does not overlap with the polarizing plate.

Accordingly, the buffer member shields and/or dissipates heat from the heat source to the polarizing plate during the thermo-compression bonding, which makes it possible to sufficiently prevent the polarizing plate from being heated locally and reduce thermal damage directly inflicted on the polarizing plate during thermo-compression bonding.

Here, according to an aspect of the present invention, thermal damage directly inflicted on the polarizing plate during thermo-compression bonding can be reduced in the same manner as described above in the case where the overall thickness of the buffer member is made greater than the thickness of the buffer member in the conventional method for manufacturing a liquid crystal display device, or in other words, in the case where the thickness of the part of the buffer member that overlaps with the polarizing plate is the same as the thickness of the part that does not overlap with the polarizing plate and the thickness of the buffer member is greater than the thickness of the buffer member in the conventional method for manufacturing a liquid crystal display device. Accordingly, the overall thickness of the buffer member may be made greater than the thickness of the buffer member in the conventional method for manufacturing a liquid crystal display device. However, in the thermo-compression bonding of the terminal portion of the liquid crystal panel and the external circuit, the terminal portion of the liquid crystal panel and the external circuit are thermo-compression-bonded, and thus in the case where the overall thickness of the buffer member is made greater than the thickness of the buffer member in the conventional method for manufacturing a liquid crystal display device, the temperature of the heat source is raised higher than the temperature of the heat source in the conventional method for manufacturing a liquid crystal display device. Accordingly, it is preferable that the thickness of the part of the buffer member that overlaps with the polarizing plate be greater than the thickness of the part that does not overlap with the polarizing plate.

Meanwhile, although there is no special limitation on the thickness of the part of the buffer member that overlaps with the polarizing plate, it is preferable that the thickness be greater than or equal to 0.2 mm and less than or equal to 2.0 mm.

Meanwhile, although there is no special limitation, it is preferable that the width of the part of the buffer member that overlaps with the polarizing plate (for example, in a pressure bonding device 10 illustrated in FIG. 1, a horizontal distance L1 from an end face of the polarizing plate 15b facing a heat source 11 to an end portion of the buffer member 12 on a side opposite from the heat source 11) be approximately ½ to ⅔ the overall width of the buffer member. For example, in the case where the overall width of the buffer member is 1.9 mm, it is preferable that the width of the part of the buffer member that overlaps with the polarizing plate be greater than or equal to 1.0 mm and less than or equal to 1.3 mm.

Here, according to an aspect of the present invention, it is preferable that the part of the buffer member that overlaps with the polarizing plate be configured from the heat shield member.

Accordingly, the buffer member shields heat from the heat source to the polarizing plate during the thermo-compression bonding, which makes it possible to reduce thermal damage directly inflicted on the polarizing plate during thermo-compression bonding.

Here, according to an aspect of the present invention, it is preferable that the part of the buffer member that overlaps with the polarizing plate be configured by layering the heat shield member and the heat dissipation portion.

Accordingly, the buffer member shields and dissipates heat from the heat source to the polarizing plate during the thermo-compression bonding, which makes it possible to reduce thermal damage directly inflicted on the polarizing plate during thermo-compression bonding.

Here, although the foregoing is a case where the buffer member overlaps with the polarizing plate, a similar effect as in the case where the buffer member overlaps with the polarizing plate can be achieved in the case where the buffer member makes contact with the polarizing plate as well, and thus the same configuration is preferable in the case where the buffer member makes contact with the polarizing plate as well.

In other words, according to an aspect of the present invention, it is preferable that the buffer member include the heat shield member and/or the heat dissipation portion; and that in the thermo-compression bonding, a part of the buffer member that makes contact with the polarizing plate be configured from the heat shield member and/or the heat dissipation portion, and the thickness of that part be greater than the thickness of a part that does not make contact with the polarizing plate.

Accordingly, the buffer member shields and/or dissipates heat from the heat source to the polarizing plate during the thermo-compression bonding, which makes it possible to reduce thermal damage directly inflicted on the polarizing plate during thermo-compression bonding.

Here, according to an aspect of the present invention, thermal damage directly inflicted on the polarizing plate during thermo-compression bonding can be reduced in the same manner as described above in the case where the overall thickness of the buffer member is made greater than the thickness of the buffer member in the conventional method for manufacturing a liquid crystal display device, or in other words, in the case where the thickness of the part of the buffer member that makes contact with the polarizing plate is the same as the thickness of the part that does not make contact with the polarizing plate and the thickness of the buffer member is greater than the thickness of the buffer member in the conventional method for manufacturing a liquid crystal display device. Accordingly, the overall thickness of the buffer member may be made greater than the thickness of the buffer member in the conventional method for manufacturing a liquid crystal display device. However, in the thermo-compression bonding of the terminal portion of the liquid crystal panel and the external circuit, the terminal portion of the liquid crystal panel and the external circuit are thermo-compression-bonded, and thus in the case where the overall thickness of the buffer member is made greater than the thickness of the buffer member in the conventional method for manufacturing a liquid crystal display device, it is necessary to raise the temperature of the heat source higher than the temperature of the heat source in the conventional method for manufacturing a liquid crystal display device. Accordingly, it is preferable that the thickness of the part of the buffer member that makes contact with the polarizing plate be greater than the thickness of the part that does not make contact with the polarizing plate.

Meanwhile, although there is no special limitation on the thickness of the part of the buffer member that makes contact with the polarizing plate, it is preferable that the thickness be greater than or equal to 0.2 mm and less than or equal to 2.0 mm.

Meanwhile, although there is no special limitation, it is preferable that the width of the part of the buffer member that makes contact with the polarizing plate (for example, in the pressure bonding device 10 illustrated in FIG. 1, the horizontal distance L1 from the end surface of the polarizing plate 15b facing the heat source 11 to the end portion of the buffer member 12 on the side opposite from the heat source 11) be approximately ½ to ⅔ the overall width of the buffer member. For example, in the case where the overall width of the buffer member is 1.9 mm, it is preferable that the width of the part of the buffer member that makes contact with the polarizing plate be greater than or equal to 1.0 mm and less than or equal to 1.3 mm.

Here, according to an aspect of the present invention, it is preferable that the part of the buffer member that makes contact with the polarizing plate be configured from the heat shield member.

Accordingly, the buffer member shields heat from the heat source to the polarizing plate during the thermo-compression bonding, which makes it possible to reduce thermal damage directly inflicted on the polarizing plate during thermo-compression bonding.

Here, according to an aspect of the present invention, it is preferable that the part of the buffer member that makes contact with the polarizing plate be configured by layering the heat shield member and the heat dissipation portion.

Accordingly, the buffer member shields and dissipates heat from the heat source to the polarizing plate during the thermo-compression bonding, which makes it possible to reduce thermal damage directly inflicted on the polarizing plate during thermo-compression bonding.

Meanwhile, in the aspect in which the part of the buffer member that makes contact with the polarizing plate is configured by layering the heat shield member and the heat dissipation portion, there is no special limitation on the thickness of the heat shield member, but it is preferable that the thickness be greater than or equal to 0.1 mm and less than or equal to 2.0 mm. There is also no special limitation on the thickness of the heat dissipation portion, but it is preferable that the thickness be greater than or equal to 0.1 mm and less than or equal to 2.0 mm.

Here, according to an aspect of the present invention, it is preferable that in the thermo-compression bonding, the pressure bonding device have the heat shield member partially laminated on the stage and/or a pedestal attached to the stage.

Accordingly, the heat shield member shields heat from the heat source to the polarizing plate during the thermo-compression bonding, which makes it possible to reduce thermal damage directly inflicted on the polarizing plate during thermo-compression bonding.

Meanwhile, although there is no special limitation on the thickness of the heat shield member partially laminated on the stage and/or the pedestal attached to the stage, it is preferable that the thickness be greater than or equal to 0.1 mm and less than or equal to 2.0 mm.

According to an aspect of the present invention, it is preferable that in the thermo-compression bonding, the entire surface of the heat shield member that faces the polarizing plate be separated from the entire surface of the polarizing plate that faces the heat shield member.

In addition, according to an aspect of the present invention, it is preferable that the thickness of the heat shield member be uniform.

Accordingly, the heat shield member shields heat from the heat source to the polarizing plate during the thermo-compression bonding, which makes it possible to reduce thermal damage directly inflicted on the polarizing plate during thermo-compression bonding.

There is no special limitation on the thickness of the heat shield member, but it is preferable that the thickness be greater than or equal to 0.1 mm and less than or equal to 2.0 mm.

Here, it is preferable that a distance between the external circuit and the polarizing plate (a distance between a COG driver 13 and the polarizing plate 15b in the pressure bonding device 10 illustrated in FIG. 1, for example) be greater than or equal to 0.3 mm and less than or equal to 2.0 mm in order to suitably realize an effect of aspects of the present invention. In the case where, for example, the distance between the external circuit and the polarizing plate is less than 0.3 mm, there are cases where, in the thermo-compression bonding, the heat source will make contact with the polarizing plate and the liquid crystal panel will be damaged. Meanwhile, in the case where, for example, the distance between the external circuit and the polarizing plate exceeds 2.0 mm, there are cases where the thermal damage reduction effect of aspects of the present invention is not fully realized.

The aforementioned aspects may be combined as appropriate without departing from the essential spirit of the present invention.

Although embodiments will be given hereinafter and the present invention will be described in further detail with reference to the drawings, the present invention is not intended to be limited to those embodiments.

Generally, the stated liquid crystal panel is basically configured of a pair of substrates on which pixel electrodes and an alignment film or the like are formed (a TFT substrate and a CF substrate, for example), a liquid crystal layer interposed between the substrates, and spacers that maintain a gap between the substrates, with the substrate being laminated using a sealing material or the like. Meanwhile, one of the substrates in the pair (the TFT substrate, for example) includes the stated terminal portion.

<Embodiment 1>

Embodiment 1 is an embodiment in which the buffer member includes the heat shield member. The part of the buffer member that makes contact with the polarizing plate is constituted of the heat shield member, and the thickness of that part is greater than the thickness of the part that does not make contact with the polarizing plate.

FIG. 1 is a cross-sectional schematic diagram illustrating members included in a pressure bonding device, a liquid crystal panel, and so on during thermo-compression bonding in a method for manufacturing a liquid crystal display device according to Embodiment 1. In Embodiment 1, the pressure bonding device 10 is basically configured of a stage 16 and the heat source 11 provided opposing the stage 16 from above, with a leading end portion of the heat source 11 being heated to a predetermined temperature. As other configurations, a driving unit (not shown) for the heat source, a case portion (not shown) for the pressure bonding device, a support portion (not shown) attached to the case portion, and so on may be included. These configurations are the same as in a pressure bonding device in the conventional method for manufacturing a liquid crystal display device.

In Embodiment 1, a polarizing plate 15a and the polarizing plate 15b are laminated to respective surfaces of a liquid crystal panel 14, and these are placed on a pedestal glass 24. A terminal portion 23 of the liquid crystal panel 14 and the COG driver 13 are then thermo-compression-bonded via the buffer member 12 interposed between the heat source 11 and the COG driver 13.

Here, in Embodiment 1, the buffer member 12 is configured by laminating a Teflon (registered trademark) tape 12a and a Teflon tape 12b together, and the Teflon tape 12a and the Teflon tape 12b serve as the heat shield member. Meanwhile, the thickness of a part of the buffer member 12 that makes contact with the polarizing plate 15b (a part on the left side in FIG. 1) corresponds to the sum of the thickness of the Teflon tape 12a and the thickness of the Teflon tape 12b, and the thickness of a part of the buffer member 12 that does not make contact with the polarizing plate 15b (a part on the right side in FIG. 1) corresponds to the thickness of the Teflon tape 12a; as such, the thickness of the part of the buffer member 12 that makes contact with the polarizing plate 15b is greater than the thickness of the part that does not make contact with the polarizing plate 15b.

Accordingly, based on the foregoing, heat from the heat source 11 to the polarizing plate 15b during the thermo-compression bonding is shielded by the buffer member 12, which makes it possible to sufficiently prevent the polarizing plate 15b from being heated locally and reduce thermal damage directly inflicted on the polarizing plate 15b during the thermo-compression bonding. Note that there is no special limitation on the display mode of the liquid crystal panel 14 in the method for manufacturing a liquid crystal display device according to Embodiment 1, and a TN (Twisted Nematic) mode, an MVA (Multi-Domain Vertical Alignment) mode, an IPS (In-Plane Switching) mode, an FFS (Fringe Field Switching) mode, and a TBA (Transverse Bend Alignment) mode can be employed, for example. The embodiment can also be suitably applied in a configuration that uses a PSA (Polymer Sustained Alignment) technique, a photoalignment technique, and so on. There are also no special limitations on pixel shapes, and the pixels may be vertically-elongated pixels, horizontally-elongated pixels, chevron-shaped pixels, or a delta arrangement.

A working example in which the method for manufacturing a liquid crystal display device according to Embodiment 1 was actually carried out will be described next.

WORKING EXAMPLE 1

The thickness of the part of the buffer member 12 that makes contact with the polarizing plate 15b is 0.3 mm, and the thickness of the part that does not make contact with the polarizing plate 15b is 0.1 mm. The width of the part of the buffer member 12 that makes contact with the polarizing plate 15b (the horizontal distance L1 from the end surface of the polarizing plate 15b facing the heat source 11 to the end portion of the buffer member 12 on the side opposite from the heat source 11) is 1.2 mm, and the distance between the COG driver 13 and the polarizing plate 15b is 0.6 mm. The length of the frame (the terminal portion aside from the display area of the liquid crystal panel 14) is 2.0 mm.

Figure 2:
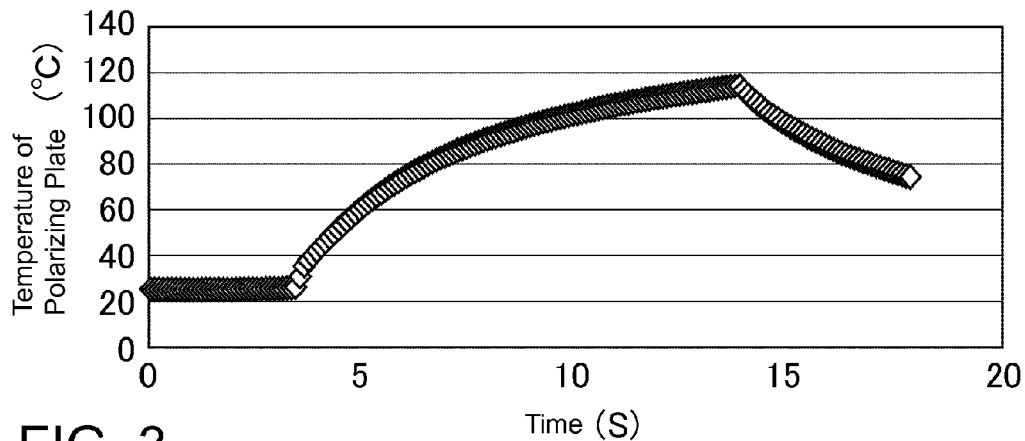
FIG. 2 is a graph illustrating a relationship between a temperature of a polarizing plate and time during thermo-compression bonding in a method for manufacturing a liquid crystal display device according to Working Example 1.

Next, the temperature of the polarizing plate 15b during the thermo-compression bonding was measured in order to grasp a relationship between the temperature of the polarizing plate and time in the method for manufacturing a liquid crystal display device according to Working Example 1. FIG. 2 is a graph illustrating the relationship between the temperature of the polarizing plate and time during the thermo-compression bonding in the method for manufacturing a liquid crystal display device according to Working Example 1. Here, a connection time when connecting the heat source 11 and the COG driver 13 via the buffer member 12 is 10 seconds. The temperature of the heat source 11 is 350° C.

As illustrated in FIG. 2, the maximum temperature attained by the polarizing plate in the method for manufacturing a liquid crystal display device according to Working Example 1 is no greater than 120° C.; as a result, it can be seen that the polarizing plate 15b will not be discolored, and there is no resulting risk of inducing light leakage in the liquid crystal display device.

<Embodiment 2>

Embodiment 2 is an embodiment in which the buffer member includes the heat shield member and the heat dissipation portion, the part of the buffer member that makes contact with the polarizing plate is constituted by layering the heat shield member and the heat dissipation portion, and the thickness of that part is greater than the thickness of the part that does not make contact with the polarizing plate.

Figure 3:
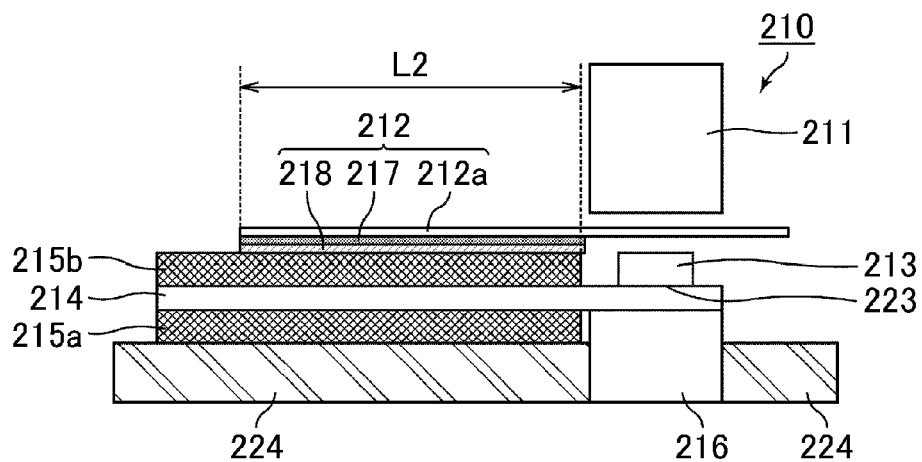
FIG. 3 is a cross-sectional schematic diagram illustrating members included in a pressure bonding device, a liquid crystal panel, and so on during thermo-compression bonding in a method for manufacturing a liquid crystal display device according to Embodiment 2.
Figure 10:
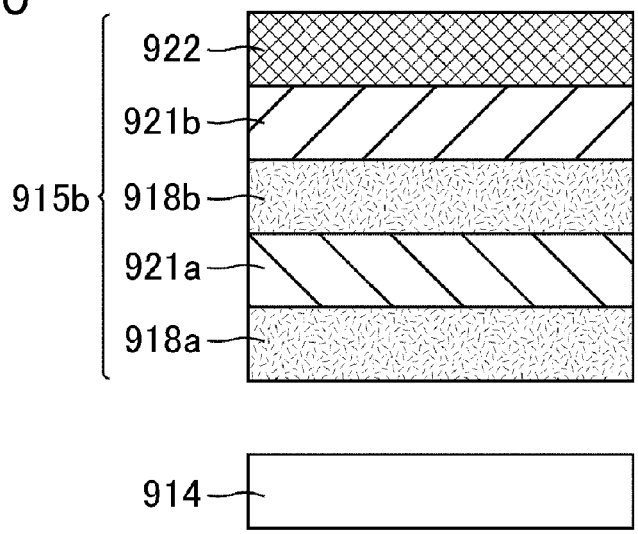
FIG. 10 is a cross-sectional schematic diagram illustrating the configuration of a liquid crystal panel provided in a liquid crystal display device and a polarizing plate, which is different from the polarizing plate in FIG. 9, on the liquid crystal panel.
Figure 11:
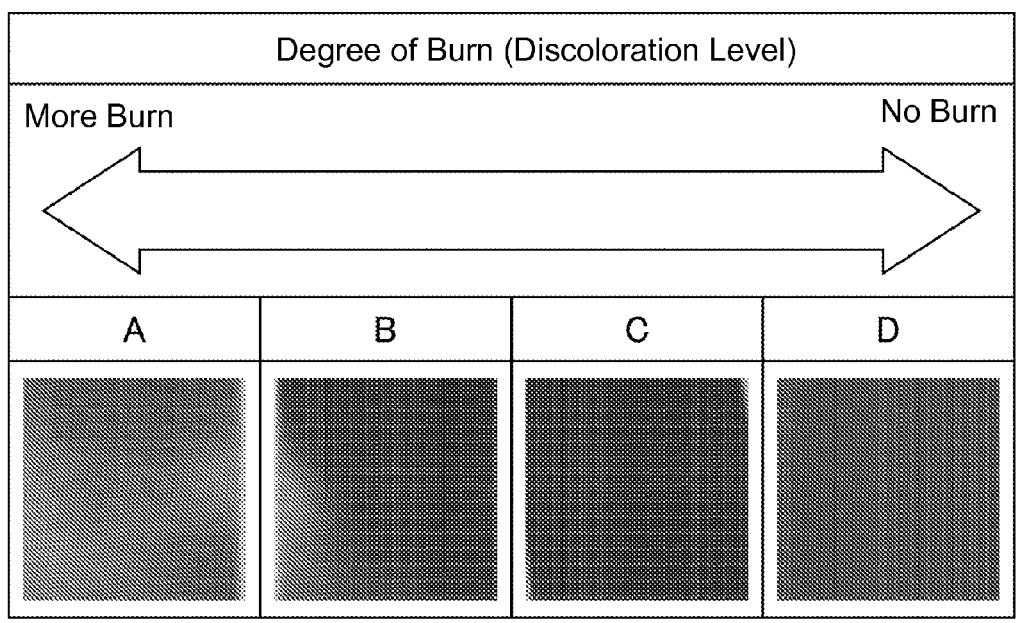
FIG. 11 shows photographs illustrating discoloration levels in a polarizing plate provided in a liquid crystal display device.
Figure 12:
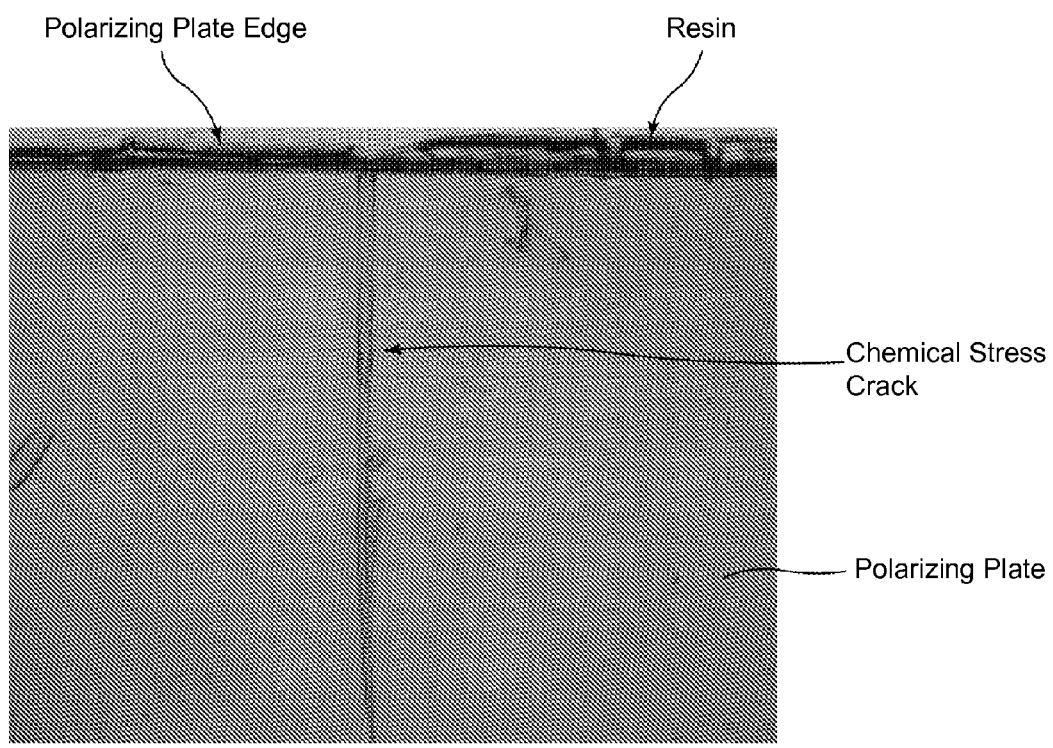
FIG. 12 is a photograph showing a crack in a polarizing plate provided in a liquid crystal display device.
Figure 13:
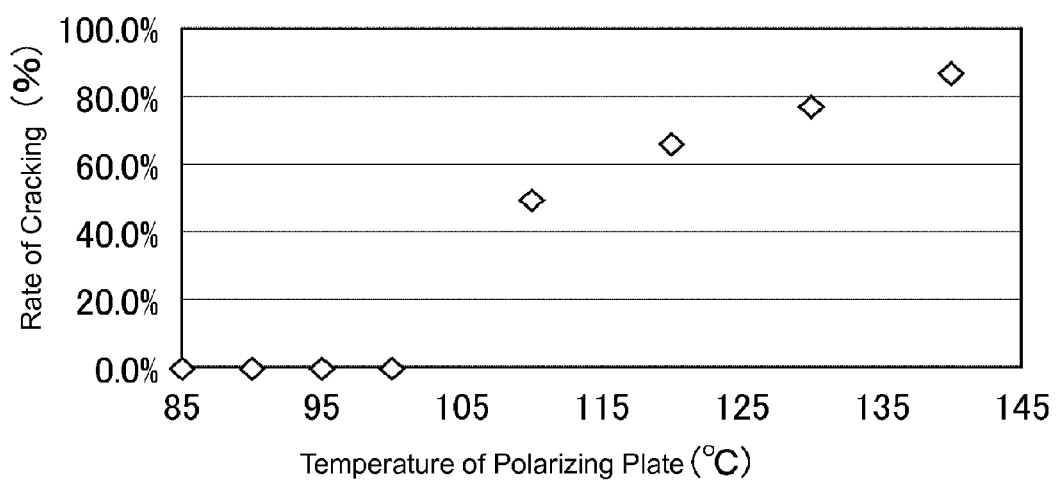
FIG. 13 is a graph illustrating a relationship between the rate at which cracking occurs in a polarizing plate provided in a liquid crystal display device and a temperature of the polarizing plate.
Figure 14:
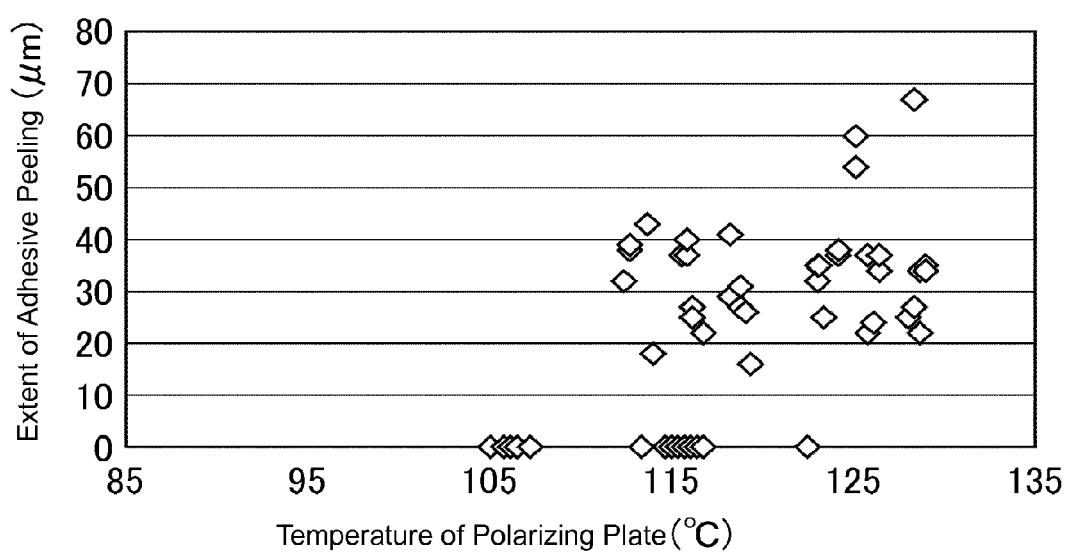
FIG. 14 is a graph illustrating a relationship between the extent to which an adhesive peels in a polarizing plate provided in a liquid crystal display device and the temperature of the polarizing plate.

FIG. 3 is a cross-sectional schematic diagram illustrating members included in a pressure bonding device, a liquid crystal panel, and so on during thermo-compression bonding in a method for manufacturing a liquid crystal display device according to Embodiment 2. In Embodiment 2, a pressure bonding device 210 is basically configured of a stage 216 and a heat source 211 provided opposing the stage 216 from above, with a leading end portion of the heat source 211 being heated to a predetermined temperature. As other configurations, a driving unit (not shown) for the heat source, a case portion (not shown) for the pressure bonding device, a support portion (not shown) attached to the case portion, and so on may be included.

In Embodiment 2, a polarizing plate 215a and a polarizing plate 215b are laminated to respective surfaces of a liquid crystal panel 214, and these are placed on a pedestal glass 224. A terminal portion 223 of the liquid crystal panel 214 and a COG driver 213 are then thermo-compression-bonded via a buffer member 212 interposed between the heat source 211 and the COG driver 213.

Here, in Embodiment 2, the buffer member 212 is configured by laminating a Teflon tape 212a, a heat dissipation plate 217, and an adhesive 218, with the Teflon tape 212a serving as the heat shield member and the heat dissipation plate 217 serving as the heat dissipation portion. Meanwhile, the thickness of a part of the buffer member 212 that makes contact with the polarizing plate 215b corresponds to the sum of the thickness of the Teflon tape 212a, the thickness of the heat dissipation plate 217, and the thickness of the adhesive 218, and the thickness of a part of the buffer member 212 that does not make contact with the polarizing plate 215b corresponds to the thickness of the Teflon tape 212a; as such, the thickness of the part of the buffer member 212 that makes contact with the polarizing plate 215b is greater than the thickness of the part that does not make contact with the polarizing plate 215b.

Accordingly, based on the foregoing, the buffer member 212 shields and dissipates heat from the heat source 211 to the polarizing plate 215b during the thermo-compression bonding, which makes it possible to reduce thermal damage directly inflicted on the polarizing plate 215b during thermo-compression bonding.

The thickness of the part of the buffer member 212 that makes contact with the polarizing plate 215b is 2.0 mm, and the thickness of the part that does not make contact with the polarizing plate 215b is 0.1 mm. The width of the part of the buffer member 212 that makes contact with the polarizing plate 215b (a horizontal distance L2 from the end surface of the polarizing plate 215b facing the heat source 211 to the end portion of the buffer member 212 on the side opposite from the heat source 211) is 0.4 mm, and the distance between the COG driver 213 and the polarizing plate 215b is 1.6 mm.

Other configurations of the pressure bonding device in the method for manufacturing a liquid crystal display device according to Embodiment 2 are the same as the pressure bonding device in the method for manufacturing a liquid crystal display device according to Embodiment 1.

<Embodiment 3>

Embodiment 3 is an embodiment in which the pressure bonding device includes the heat shield member partially laminated to a platform attached to the stage.

FIG. 4 is a cross-sectional schematic diagram illustrating members included in a pressure bonding device, a liquid crystal panel, and so on during thermo-compression bonding in a method for manufacturing a liquid crystal display device according to Embodiment 3. In Embodiment 3, a pressure bonding device 310 is basically configured of a stage 316 and a heat source 311 provided opposing the stage 316 from above, with a leading end portion of the heat source 311 being heated to a predetermined temperature. As other configurations, a driving unit (not shown) for the heat source, a case portion (not shown) for the pressure bonding device, a support portion (not shown) attached to the case portion, and so on may be included.

In Embodiment 3, a polarizing plate 315a and a polarizing plate 315b are laminated to respective surfaces of a liquid crystal panel 314, and these are placed on a pedestal glass 324. A terminal portion 323 of the liquid crystal panel 314 and a COG driver 313 are then thermo-compression-bonded via a buffer member 312 interposed between the heat source 311 and the COG driver 313.

Here, in Embodiment 3, a Teflon tape 319a and a Teflon tape 319b are partially laminated to the pedestal glass 324, and the Teflon tape 319a and the Teflon tape 319b serve as the heat shield member.

Accordingly, based on the foregoing, the Teflon tape 319a and the Teflon tape 319b shield heat from the heat source 311 to the polarizing plate 315b during the thermo-compression bonding, which makes it possible to reduce thermal damage directly inflicted on the polarizing plate 315b during thermo-compression bonding.

The thickness of the Teflon tape 319a and the Teflon tape 319b is 2.0 mm. The material of the buffer member 312 is Teflon tape, the thickness of the buffer member 312 is 0.1 mm, and the width of the part of the buffer member 312 that makes contact with the polarizing plate 315b (a horizontal distance L3 from the end surface of the polarizing plate 315b facing the heat source 311 to the end portion of the buffer member 312 on the side opposite from the heat source 311) is 1.2 mm. The distance between the COG driver 313 and the polarizing plate 315b is 0.4 mm.

Other configurations of the pressure bonding device in the method for manufacturing a liquid crystal display device according to Embodiment 3 are the same as the pressure bonding device in the method for manufacturing a liquid crystal display device according to Embodiment 1.

<Embodiment 4>

According to an aspect of the present invention, it is preferable that in the thermo-compression bonding, a heat shield material be laminated to a surface, of at least one polarizing plate bonded to the liquid crystal panel, that is on a side opposite from the liquid crystal panel, and that the thickness of the heat shield material be greater than or equal to 30 µm. Embodiment 4 is an embodiment in which the heat shield material is laminated to a surface, of one polarizing plate bonded to the liquid crystal panel, that is on a side opposite from the liquid crystal panel, and the thickness of the heat shield material is greater than or equal to 30 µm and uniform.

FIG. 5 is a cross-sectional schematic diagram illustrating members included in a pressure bonding device, a liquid crystal panel, and so on during thermo-compression bonding in a method for manufacturing a liquid crystal display device according to Embodiment 4. In Embodiment 4, a pressure bonding device 410 is basically configured of a stage 416 and a heat source 411 provided opposing the stage 416 from above, with a leading end portion of the heat source 411 being heated to a predetermined temperature. As other configurations, a driving unit (not shown) for the heat source, a case portion (not shown) for the pressure bonding device, a support portion (not shown) attached to the case portion, and so on may be included.

In Embodiment 4, a polarizing plate 415a and a polarizing plate 415b are laminated to respective surfaces of a liquid crystal panel 414, and these are placed on a pedestal glass 424. A terminal portion 423 of the liquid crystal panel 414 and a COG driver 413 are then thermo-compression-bonded via a buffer member 412 interposed between the heat source 411 and the COG driver 413.

Here, in Embodiment 4, a laminate 420 is laminated to the polarizing plate 415b on the side opposite from the liquid crystal panel 414, and the laminate 420 serves as the heat shield material.

Accordingly, based on the foregoing, the laminate 420 shields heat from the heat source 411 to the polarizing plate 415b during the thermo-compression bonding, which makes it possible to reduce thermal damage directly inflicted on the polarizing plate 415b during thermo-compression bonding.

The thickness of the laminate 420 is greater than or equal to 30 μm and less than or equal to 1000 μm, and is uniform. The material of the buffer member 412 is Teflon tape, the thickness of the buffer member 412 is 0.1 mm, and the width of the part of the buffer member 412 that makes contact with the polarizing plate 415b (a horizontal distance L4 from the end surface of the polarizing plate 415b facing the heat source 411 to the end portion of the buffer member 412 on the side opposite from the heat source 411) is 1.2 mm. The distance between the COG driver 413 and the polarizing plate 415b is 1.6 mm.

Other configurations of the pressure bonding device in the method for manufacturing a liquid crystal display device according to Embodiment 4 are the same as the pressure bonding device in the method for manufacturing a liquid crystal display device according to Embodiment 1.

COMPARISON EXAMPLE 1

Comparison Example 1 is a pressure bonding device in a conventional method for manufacturing a liquid crystal display device.

FIG. 6 is a cross-sectional schematic diagram illustrating members included in a pressure bonding device, a liquid crystal panel, and so on during thermo-compression bonding in a conventional method for manufacturing a liquid crystal display device according to Comparison Example 1. In Comparison Example 1, the pressure bonding device 510 is basically configured of a stage 516 and the heat source 511 provided opposing the stage 516 from above, with a leading end portion of the heat source 511 being heated to a predetermined temperature. As other configurations, a driving unit (not shown) for the heat source, a case portion (not shown) for the pressure bonding device, a support portion (not shown) attached to the case portion, and so on may be included.

In Comparison Example 1, a polarizing plate 515a and the polarizing plate 515b are laminated to respective surfaces of a liquid crystal panel 514, and these are placed on a pedestal glass 524. The terminal portion 523 of the liquid crystal panel 514 and the COG driver 513 are then thermo-compression-bonded via a buffer member 512 interposed between the heat source 511 and the COG driver 513.

The material of the buffer member 512 is Teflon tape, the thickness of the buffer member 512 is 0.1 mm, and the width of the part of the buffer member 512 that makes contact with the polarizing plate 515b (a horizontal distance L5 from the end surface of the polarizing plate 515b facing the heat source 511 to the end portion of the buffer member 512 on the side opposite from the heat source 511) is 1.2 mm. The distance between the COG driver 513 and the polarizing plate 515b is 0.6 mm. The length of the frame (the terminal portion aside from the display area of the liquid crystal panel 514) is 2.0 mm.

Other configurations of the pressure bonding device in the method for manufacturing a liquid crystal display device according to Comparison Example 1 are the same as the pressure bonding device in the method for manufacturing a liquid crystal display device according to Embodiment 1.

Next, the temperature of the polarizing plate 515b during the thermo-compression bonding was measured in order to grasp a relationship between the temperature of the polarizing plate and time in the conventional method for manufacturing a liquid crystal display device according to Comparison Example 1. FIG. 7 is a graph illustrating the relationship between the temperature of the polarizing plate and time during thermo-compression bonding in the conventional method for manufacturing a liquid crystal display device according to Comparison Example 1. Here, a connection time when connecting the heat source 511 and the COG driver 513 via the buffer member 512 is 10 seconds. The temperature of the heat source 511 is 350° C.

As illustrated in FIG. 7, the maximum temperature attained by the polarizing plate in the conventional method for manufacturing a liquid crystal display device according to Comparison Example 1 exceeds 120° C.; as a result, it can be seen that the polarizing plate 515b will be discolored, and there is a resulting risk of inducing light leakage in the liquid crystal display device.

<Other Embodiments>

In the embodiments of the present invention, oxide semiconductor TFTs can be suitably used (an IGZO (In—Ga—Zn—O semiconductor) is particularly preferable). These oxide semiconductor TFTs will be described in detail hereinafter.

Normally, the stated TFT substrate includes thin-film transistor elements. It is preferable that the thin-film transistor elements include oxide semiconductors. In other words, in a thin-film transistor element, it is preferable that an active layer of active driving elements be formed using an oxide semiconductor film of zinc oxide or the like instead of a silicon semiconductor film. Such a TFT is called an "oxide semiconductor TFT". An oxide semiconductor exhibits a higher carrier mobility than amorphous silicon, and has a characteristic of having lower degrees of variation in its properties. Accordingly, an oxide semiconductor TFT can operate at higher speeds than an amorphous silicon TFT and has a high driving frequency, and is thus preferable for driving next-generation display devices, which have high resolutions. In addition, an oxide semiconductor film is formed through a simpler process than a polycrystalline silicon film, and thus has an advantage in that the oxide semiconductor film can be applied even in devices that require large surface areas.

Of Embodiments 1 to 4, Embodiment 1 is particularly preferable as an embodiment that can reduce thermal damage directly inflicted on the polarizing plate.

The respective aspects described in the aforementioned embodiments may be combined as appropriate without departing from the essential spirit of the present invention. For example, the Teflon tape according to Embodiment 1, whose thickness varies by location, may be combined with the Teflon tape according to Embodiment 3 and/or the laminate according to Embodiment 4, whose thickness is greater than or equal to 30 μm and less than or equal to 1000 μm. As a result, the maximum temperature attained by the polarizing plate can be reduced further.

DESCRIPTION OF REFERENCE CHARACTERS 10, 210, 310, 410, 510 pressure bonding device
11, 211, 311, 411, 511 heat source
12, 212, 312, 412, 512 buffer member
12a, 12b, 212a, 319a, 319b Teflon tape
13, 213, 313, 413, 513 COG driver
14, 214, 314, 414, 514, 814, 914 liquid crystal panel
15a, 15b, 215a, 215b, 315a, 315b, 415a, 415b, 515a, 515b, 815b, 915b polarizing plate
16, 216, 316, 416, 516 stage 217 heat dissipation plate
218, 818, 918a, 918b adhesive
420 laminate
821, 921a, 921b retardation plate
822, 922 polarizer
23, 223, 323, 423, 523 terminal portion
24, 224, 324, 424, 524 pedestal glass
TFT thin-film transistor
CF color filter

What is claimed is:

1. A method of manufacturing a liquid crystal display device in which a terminal portion of a liquid crystal panel and an external circuit are bonded together by thermo-compression using a pressure bonding device comprising a stage and a heat source, the method comprising:
    placing the liquid crystal panel on the stage; and
    thermo-compression bonding the terminal portion of the liquid crystal panel to the external circuit with heat from the heat source using a buffer member, at least a portion of the buffer member being interposed between the heat source and the external circuit during the thermo-compressing bonding,
    wherein, in the step of thermo-compression bonding, a heat shield member is used such that said heat shield member overlaps with at least a part of a polarizing plate bonded to the liquid crystal panel in a plan view, and is in direct contact with said at least part of said polarizing plate, the heat shield member shielding the polarizing plate on the liquid crystal panel from heat from the heat source.

2. The method of manufacturing a liquid crystal display device according to claim 1, wherein a thickness of the buffer member varies by location.

3. The method of manufacturing a liquid crystal display device according to claim 2,
    wherein, in the step of thermo-compression bonding, a part of the buffer member overlaps with the polarizing plate, said part of the buffer member includes said heat shield member, and a thickness of said part of the buffer member is greater than a thickness of a part thereof that does not overlap with the polarizing plate.

4. The method of manufacturing a liquid crystal display device according to claim 1, wherein, in the step of thermo-compression bonding, the pressure bonding device has the heat shield member partially laminated on the stage and a pedestal attached to the stage.

5. The method of manufacturing a liquid crystal display device according to claim 1,
    wherein a thickness of the heat shield member is greater than or equal to 30 μm.

6. The method of manufacturing a liquid crystal display device according to claim 1, wherein a thickness of the heat shield member is uniform.

7. A method of manufacturing a liquid crystal display device in which a terminal portion of a liquid crystal panel and an external circuit are bonded together by thermo-compression using a pressure bonding device comprising a stage and a heat source, the method comprising:
    placing the liquid crystal panel on the stage; and
    thermo-compression bonding the terminal portion of the liquid crystal panel to the external circuit with heat from the heat source using a buffer member, at least a portion of the buffer member being interposed between the heat source and the external circuit during the thermo-compressing bonding,
    wherein, in the step of thermo-compression bonding, a part of the buffer member overlaps with at least a part of a polarizing plate bonded to the liquid crystal panel in a plan view, and said part of the buffer member includes an adhesive layer and at least one of a heat shield member and a heat dissipation member, the heat shield member shielding a polarizing plate on the liquid crystal panel from heat from the heat source, the heat dissipation member dissipating heat from the heat source, and
    wherein the adhesive layer in the said part of the buffer member makes direct contact with said at least part of the polarizing plate.

8. The method of manufacturing a liquid crystal display device according to claim 7, wherein a thickness of the buffer member varies by location.

9. The method of manufacturing a liquid crystal display device according to claim 8,
    wherein, in the step of thermo-compression bonding, a thickness of said part of the buffer member that overlaps with said at least part of the polarizing plate is greater than a thickness of a part thereof that does not overlap with said at least part of the polarizing plate.

10. The method of manufacturing a liquid crystal display device according to claim 7, wherein the part of the buffer member that overlaps with the polarizing plate includes the heat shield member.

11. The method of manufacturing a liquid crystal display device according to claim 7, wherein the part of the buffer member that overlaps with said at least part of the polarizing plate includes the heat shield member and the heat dissipation member that are layered together.

* * * * *